United States Patent
Lee et al.

(10) Patent No.: US 9,577,224 B2
(45) Date of Patent: Feb. 21, 2017

(54) ORGANIC LIGHT EMITTING DEVICE

(71) Applicant: LG Display Co., Ltd., Seoul (KR)

(72) Inventors: Jae In Lee, Seoul (KR); Se Hwan Son, Daejeon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/491,605

(22) Filed: Sep. 19, 2014

(65) Prior Publication Data
US 2015/0008422 A1 Jan. 8, 2015

Related U.S. Application Data (63) Continuation of application No. PCT/KR2013/002463, filed on Mar. 25, 2013.

(30) Foreign Application Priority Data

Mar. 23, 2012 (KR) .................. 10-2012-0030247
Jul. 31, 2012 (KR) .................. 10-2012-0084214

(51) Int. Cl.
*H01L 51/52* (2006.01)
*H05B 33/10* (2006.01)
*H05B 33/22* (2006.01)
*H01L 51/50* (2006.01)

(52) U.S. Cl.
CPC ....... *H01L 51/5275* (2013.01); *H01L 51/5072* (2013.01); *H01L 51/5218* (2013.01); *H01L 51/5234* (2013.01); *H01L 51/5253* (2013.01); *H01L 51/5268* (2013.01); *H05B 33/10* (2013.01); *H05B 33/22* (2013.01); *H01L 2251/5369* (2013.01)

(58) Field of Classification Search
CPC .................. H01L 51/5275; H01L 51/5268
See application file for complete search history.

(56) References Cited

U.S. PATENT DOCUMENTS

| | | | | |
|---|---|---|---|---|
| 6,798,135 | B2* | 9/2004 | Lin | H01L 51/5012 313/504 |
| 7,629,739 | B2* | 12/2009 | Han | H01L 51/5262 313/504 |
| 2006/0255332 | A1* | 11/2006 | Becker | C09K 11/06 257/40 |
| 2007/0042517 | A1 | 2/2007 | Haseqawa et al. | |
| 2007/0132378 | A1* | 6/2007 | Cok | H01L 51/5268 313/506 |

(Continued)

FOREIGN PATENT DOCUMENTS

| | | |
|---|---|---|
| JP | 11-26156 A | 1/1999 |
| JP | 2005-510034 A | 4/2005 |

(Continued)

OTHER PUBLICATIONS

You, et al: "Refractive index, optical bandgap and oscillator parameters of organic films deposited by vacuum evaporation technique", Vacuum, Pergamon Press, GB, vol. 83, No. 6, pp. 984-988, XP025923870, Feb. 12, 2009.

*Primary Examiner* — Michele Fan
(74) *Attorney, Agent, or Firm* — Dentons US LLP (57) ABSTRACT

Provided are an organic light emitting device (OLED) and lighting. The illustrative OLED may minimize light absorption of a reflective electrode layer and evanescent coupling by surface plasmon, and exhibit excellent emitting efficiency.

17 Claims, 9 Drawing Sheets

(56) References Cited

U.S. PATENT DOCUMENTS

| | | | | |
|---|---|---|---|---|
| 2007/0222372 | A1* | 9/2007 | Cok | H01L 51/5268 313/504 |
| 2008/0203908 | A1* | 8/2008 | Hasegawa | H01L 51/5237 313/504 |
| 2009/0051277 | A1* | 2/2009 | Inoue | B82Y 20/00 313/504 |
| 2009/0218934 | A1* | 9/2009 | Song | H01L 51/002 313/504 |
| 2009/0230841 | A1* | 9/2009 | Boerner | H01L 51/5268 313/504 |
| 2010/0320481 | A1* | 12/2010 | Kashiwabara | H01L 27/3244 257/88 |
| 2011/0024779 | A1* | 2/2011 | Nakamura | B82Y 20/00 257/98 |
| 2011/0240968 | A1* | 10/2011 | Kim | H01L 51/0061 257/40 |
| 2011/0260953 | A1 | 10/2011 | Lin et al. | |
| 2011/0278622 | A1* | 11/2011 | Wada | C03C 3/16 257/98 |
| 2013/0026461 | A1 | 1/2013 | Nakamura | |
| 2013/0032840 | A1* | 2/2013 | Cho | H01L 51/5212 257/98 |
| 2013/0181195 | A1* | 7/2013 | Cho | H01L 51/5203 257/40 |
| 2014/0008635 | A1* | 1/2014 | Kitagaki | G02B 5/0242 257/40 |

FOREIGN PATENT DOCUMENTS

| | | | | | |
|---|---|---|---|---|---|
| JP | 2006-74022 | A | | 3/2006 | |
| JP | 2006100042 | A | * | 4/2006 | |
| JP | 2006-128100 | A | | 5/2006 | |
| JP | 2006-157022 | A | | 6/2006 | |
| JP | 2006-286616 | A | | 10/2006 | |
| JP | 2007-242927 | A | | 9/2007 | |
| JP | 2008-021872 | | | 1/2008 | |
| JP | 2009004274 | A | * | 1/2009 | |
| JP | 2011-014534 | | | 1/2011 | |
| JP | 2011-048937 | | | 3/2011 | |
| JP | 2011-243625 | | | 12/2011 | |
| JP | 2012-9336 | A | | 1/2012 | |
| JP | WO 2012137398 | A1 | * | 10/2012 | G02B 5/0242 |
| KR | 10-1114352 | B1 | | 2/2012 | |
| TW | 201137467 | A1 | | 11/2011 | |
| TW | 201203649 | A1 | | 1/2012 | |
| WO | 2010140629 | A1 | | 12/2010 | |
| WO | 2011-126097 | | | 10/2011 | |

* cited by examiner

ORGANIC LIGHT EMITTING DEVICE

This application is a Continuation Bypass of International Application No. PCT/KR2013/002463, filed Mar. 25, 2013, and claims the benefit of Korean Application Nos. 10-2012-0030247, filed on Mar. 23, 2012 and 10-2012-0084214, filed on Jul. 31, 2012, all of which are hereby incorporated by reference in their entirety for all purposes as if fully set forth herein.

FIELD

The present application relates to an organic light emitting device (OLED) and lighting.

BACKGROUND

Conventionally, an OLED sequentially includes a substrate, a first electrode layer, an organic layer including an emitting layer and a second electrode layer.

In a structure known as a bottom emitting device, the first electrode layer may be a transparent electrode layer, and the second electrode layer may be a reflective electrode layer. In addition, in a structure known as a top emitting device, the first electrode layer may be formed as a reflective electrode layer, and the second electrode layer may be formed as a transparent electrode layer.

Electrons and holes are injected respectively by the two electrode layers, the injected electrons and holes are recombined in the emitting layer located in the emitting layer, resulting in generating light. The light may be emitted toward the substrate in the bottom emitting device, or toward the second electrode layer in the top emitting device.

In the structure of the OLED, indium tin oxide (ITO) generally used as the transparent electrode layer, the organic layer, and the substrate, which is conventionally formed of glass, have refractive indexes of approximately 2.0, 1.8, and 1.5, respectively. In such a relationship of the refractive index, for example, the light generated in the organic emitting layer in the bottom emitting device is trapped at an interface between the organic layer and the first electrode layer or in the substrate due to a total internal reflection phenomenon, and only a very small amount of light is emitted.

DESCRIPTION

Object

The present application is directed to providing an OLED and lighting.

Solution

One aspect of the present application provides an illustrative OLED, including: an electron injection electrode layer and a hole injection electrode layer. In the OLED, the electron injection electrode layer and the hole injection electrode layer may face each other, and an organic stacked structure may be present therebetween. The organic stacked structure may be a stacked structure including at least one layer including a functional organic material. The organic stacked structure may include a low refractive organic layer. The term "low refractive organic layer" used herein may refer to a layer having an organic compound and a refractive index of 1.7 or less. The term "refractive index" used herein may refer to, unless particularly defined otherwise, a refractive index with respect to light having a wavelength of approximately 550 to 633 nm. The organic stacked structure may include an emitting layer along with the low refractive organic layer.

The OLED may include a scattering layer. The scattering layer may be formed in contact with or adjacent to one surface of, for example, the electron or hole injection electrode layer, particularly, the hole injection electrode layer. Here, one surface of the electrode layer in contact with or adjacent to the scattering layer may be a surface opposite to the surface of the electrode layer in contact with or adjacent to the organic stacked structure.

In one embodiment, the OLED may further include a base layer. On the top of the base layer, a structure in which the electron or hole injection electrode layer, the organic stacked structure and the hole or electron injection electrode layer are sequentially formed may be formed. In this structure, the scattering layer may be disposed between the base layer and the electron or hole injection electrode layer formed on the top of the base layer.

Figure 1:
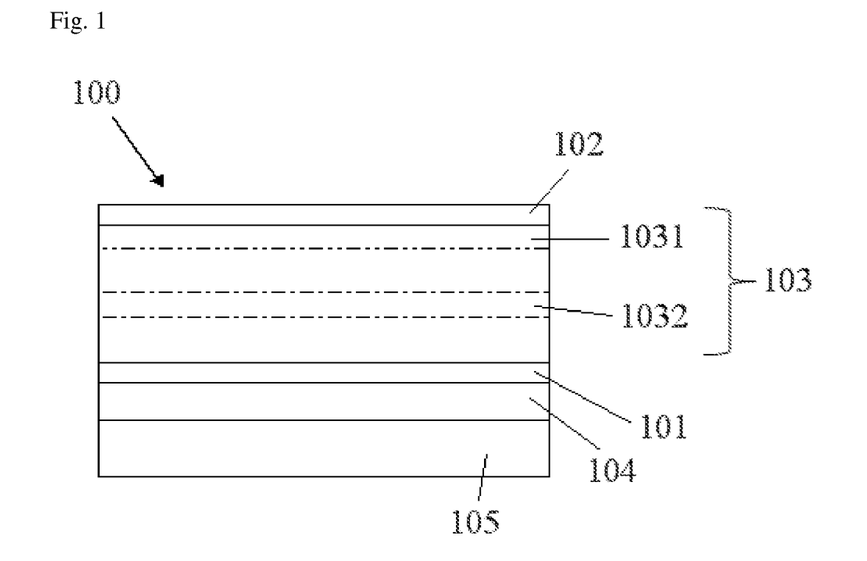
FIG. 1 shows a schematic of an illustrative embodiment of the OLED.

FIG. 1 shows a structure 100 of an illustrative OLED, in which a hole injection electrode layer 101, an organic stacked structure 103 and an electron injection electrode layer 102 are sequentially stacked on a base layer 105, and a scattering layer 104 is formed between the hole injection electrode layer 101 and the base layer. The organic stacked structure 103 includes a low refractive organic layer 1031 and an emitting layer 1032.

As the base layer, a suitable material may be selected according to necessity without particular limitation. In one embodiment, the OLED may be a bottom emitting device, and in this case, the base layer may be a transparent base layer, for example, a base layer having transmittance of 50, 60, 70, 80 or 90% or more with respect to light having a wavelength in a visible region. As the transparent base layer, a glass base layer or a transparent polymer base layer may be used. As the glass base layer, a base layer including soda lime glass, barium/strontium-containing glass, lead glass, alumino silicate glass, borosilicate glass, barium borosilicate glass, or quartz may be used, and as the polymer base layer, a base layer including polycarbonate (PC), an acryl resin, poly(ethylene terephthalate) (PET), poly(ether sulfide) (PES), or polysulfone (PS) may be used, but the present application is not limited thereto. As needed, the base layer may be a TFT substrate having a drive TFT.

The hole injection electrode layer may be formed using, for example, a transparent conductive material having a relatively highly work function. For example, the hole injection electrode layer may include a metal, an alloy, an electric conductive compound having a work function of approximately 4.0 eV or more, or a mixture of at least two thereof. Such a material may be a conductive transparent material, for example, a metal such as gold, CuI, indium tin oxide (ITO), indium zinc oxide (IZO), ZnO, $SnO_2$ or $In_2O_3$. The hole injection electrode layer may be formed by, for example, vacuum deposition or sputtering using the above material. The hole injection electrode layer may have, for example, light transmittance of 10% or more, and a surface resistance of several hundreds of $\Omega$/sq or less, for example, 100 $\Omega$/sq or less. A thickness of the hole injection electrode layer may be dependent on light transmittance or surface resistance, but may conventionally be 50 to 150 nm or 10 to 200 nm.

The electron injection electrode layer may be formed using, for example, a material having a relatively small work function. As such a material, a metal such as potassium, lithium, sodium, magnesium, lanthanum, cesium, calcium, strontium, barium, aluminum, silver, indium, tin, zinc or zirconium or an alloy of two or more components selected therefrom, for example, a magnesium/indium alloy, a magnesium/aluminum alloy, an aluminum/lithium alloy, an aluminum/scandium/lithium alloy, a magnesium/silver alloy or an aluminum/calcium alloy may be used. The electron injection electrode layer may be formed using, for example, deposition or sputtering.

In the illustrative OLED, among the electron and hole injection electrode layers, an electrode layer formed on the base layer may be a transparent electrode layer, and an electrode layer formed on the organic stacked structure may be a reflective electrode layer.

The organic stacked structure at least includes a low refractive organic layer and an emitting layer.

The low refractive organic layer may be a layer including an organic compound, for example, having a refractive index of 1.7 or less, less than 1.7, 1.68, 1.66, 1.65, 1.63, 1.60, 1.55 or 1.52 or less. Here, the lower limit of the refractive index of the low refractive organic layer may be, but is not particularly limited to, for example, 0.5 or 0.7 or more.

In one embodiment, the low refractive organic layer may be formed in contact with or adjacent to an electron or hole injection electrode layer formed as a reflective electrode layer, for example, an electron injection electrode layer formed as a reflective electrode layer. The low refractive organic layer formed at this position may reduce the influence of light absorption of the reflective electrode layer by an organic interaction with the scattering layer and evanescent coupling by surface plasmon, and increase light extraction efficiency of the device.

When the electrode in contact with or adjacent to the low refractive organic layer is an electron injection electrode layer, an organic compound included in the low refractive organic layer may be an electron accepting organic compound. The low refractive organic layer including the electron accepting organic compound may serve as an electron injection layer, an electron transport layer, or an electron injection/transport layer.

As the electron accepting organic compound, a known arbitrary compound may be used without particular limitation. As such an organic compound, an aromatic amine compound such as 4,4',4"-tri(N-carbazolyl)triphenylamine; a polycyclic compound such as p-terphenyl or quaterphenyl or a derivative thereof; a polycyclic hydrocarbon compound such as naphthalene, tetracene, pyrene, coronene, chrysene, anthracene, diphenylanthracene, naphthacene, or phenanthrene or a derivative thereof; or a heterocyclic compound such as phenanthroline, bathophenanthroline, phenanthridine, acridine, quinoline, quinoxaline, or phenazine or a derivative thereof. In addition, fluoroceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bis-styryl, pyrazine, cyclopentadiene, oxine, aminoquinoline, imine, diphenylethylene, vinylanthracene, diaminocarbazole, pyrane, thiopyrane, polymethine, merocyanine, quinacridone, rubrene or a derivative thereof, a metal chelate complex compound disclosed in a patent publication such as Japanese Patent Application Laid-Open No. 1988-295695, Japanese Patent Application Laid-Open No. 1996-22557, Japanese Patent Application Laid-Open No. 1996-81472, Japanese Patent Application Laid-Open No. 1993-009470 or Japanese Patent Application Laid-Open No. 1993-017764, for example, a metal complex having at least one of metal chelated oxinoid compounds such as 8-quinolatos including tris(8-quinolinolato)aluminum, bis(8-quinolinolato)magnesium, bis[benzo(f)-8-quinolinolato]zinc, bis(2-methyl-8-quinolinolato)aluminum, tris(8-quinolinolato)indium, tris(5-methyl-8-quinolinolato)aluminum, 8-quinolinolato-lithium, tris (5-chloro-8-quinolinolato)gallium, bis(5-chloro-8-quinolinolato)calcium and derivatives thereof as a coordinator; an oxadiazole compound disclosed in a patent publication such as Japanese Patent Application Laid-Open No. 1993-202011, Japanese Patent Application Laid-Open No. 1995-179394, Japanese Patent Application Laid-Open No. 1995-278124 or Japanese Patent Application Laid-Open No. 1995-228579; a triazine compound disclosed in a patent publication such as Japanese Patent Application Laid-Open No. 1995-157473; a stilbene derivative disclosed in a patent publication such as Japanese Patent Application Laid-Open No. 1994-203963; a distyrylarylene derivative; a styryl derivative disclosed in a patent publication such as Japanese Patent Application Laid-Open No. 1994-132080 or Japanese Patent Application Laid-Open No. 1994-88072, a diolefin derivative disclosed in a patent publication such as Japanese Patent Application Laid-Open No. 1994-100857 or Japanese Patent Application Laid-Open No. 1994-207170; a fluorescent brightening agent such as a benzooxazole compound, a benzothiazole compound or a benzoimidazole compound; a distyrylbenzene compound such as 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzyl, 1,4-bis(3-ethylstyryl)benzene, 1,4-bis(2-methylstyryl)-2-methylbenzene or 1,4-bis(2-methylstyryl)-2-ethylbenzene; a distyrylpyrazine compound such as 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine or 2,5-bis[2-(1-pyrenyl)vinyl]pyrazine; a dimethylidine compound such as 1,4-phenylenedimethylidene, 4,4'-phenylenedimethylidene, 2,5-xylene dimethylidene, 2,6-naphthylenedimethylidene, 1,4-biphenylenedimethylidene, 1,4-para-terephenylene dimethylidene, 9,10-anthracenediyldimethylidine, or 4,4'-(2,2-di-ti-butylphenylvinyl)biphenyl, 4,4'-(2,2-diphenylvinyl)biphenyl or a derivative thereof; a silanamine derivative disclosed in a patent publication such as Japanese Patent Application Laid-Open No. 1994-49079 or Japanese Patent Application Laid-Open No. 1994-293778; a multifunctional styryl compound disclosed in a patent publication such as Japanese Patent Application Laid-Open No. 1994-279322 or Japanese Patent Application Laid-Open No. 1994-279323; an oxadiazole derivative disclosed in a patent publication such as Japanese Patent Application Laid-Open No. 1994-107648 or Japanese Patent Application Laid-Open No. 1994-092947; an anthracene compound disclosed in a patent publication such as Japanese Patent Application Laid-Open No. 1994-206865; an oxinate derivative disclosed in a patent publication such as Japanese Patent Application Laid-Open No. 1994-145146; a tetraphenyl butadiene compound disclosed in a patent publication such as Japanese Patent Application Laid-Open No. 1992-96990; an organic trifunctional compound disclosed in a patent publication such as Japanese Patent Application Laid-Open No. 1991-296595; a coumarin derivative disclosed in a patent publication such as Japanese Patent Application Laid-Open No. 1990-191694; a perylene derivative disclosed in a patent publication such as Japanese Patent Application Laid-Open No. 1990-196885; a naphthalene derivative disclosed in a patent publication such as Japanese Patent Application Laid-Open No. 1990-255789; a phthaloperynone derivative disclosed in a patent publication such as Japanese Patent Application Laid-Open No. 1990-289676 or Japanese Patent Application Laid-Open No. 1990-88689; or a styryl amine derivative disclosed in a patent publication such as Japanese Patent Application Laid-Open No. 1990-250292 may be used as an electron accepting organic compound included in a lowly refractive layer.

The organic compound may conventionally have a refractive index of approximately 1.7 to 1.8. To maintain the refractive index of the low refractive organic layer including such an organic compound at a low level, the low refractive organic layer may include a material having a low refractive index (hereinafter, referred to as a low refractive material) along with the organic compound. As such a low refractive material, for example, a material having a refractive index of 1.60 or less may be used. The lower limit of the refractive index of the low refractive material may be, but is not particularly limited to, for example, 0.5 or 0.7 or more. As the material, one or a mixture of at least two selected from lithium fluoride (LiF), magnesium fluoride ($MgF_2$), potassium fluoride (KF), sodium fluoride (NaF), aluminum fluoride ($AlF_2$), barium fluoride ($BaF_2$), beryllium fluoride ($BeF_2$), cadmium fluoride ($CdF_2$), calcium fluoride ($CaF_2$), cesium fluoride (CsF), thorium fluoride ($ThF_4$), yttrium fluoride ($YF_3$), iron fluoride ($FeCl_2$), vanadium fluoride ($V_2O_5$) and $Na_2Al_3F_{14}$ (Chiolite) may be used.

A content of the low refractive material included in the low refractive organic layer is not particularly limited as long as the low refractive organic layer is controlled to have a refractive index in the above-described range. In one embodiment, the low refractive material may be included at 150, 140, 130, 120, 110 or 100 parts by weight with respect to 100 parts by weight of the organic compound included in the low refractive organic layer. The unit "parts by weight" used herein refers to, unless particularly defined otherwise, a weight ratio between components. The lower limit of the ratio of the low refractive material is determined by the refractive index of the low refractive organic layer and thus is not particularly limited.

The low refractive organic layer including the organic compound and the low refractive material as described above may be formed by, for example, a codeposition method using the organic compound and the low refractive material.

The low refractive organic layer may have a thickness of, for example, 15, 18, 20, 30, 40, 50, 55, 60, 65 or 70 nm or more. In this range, the avenescent effect of the device may be minimized and light extraction efficiency may be optimized. The upper limit of the thickness of the low refractive organic layer is not particularly limited. For example, the low refractive organic layer may have a thickness of 150, 100 or 85 nm or less.

The emitting layer may be formed using, for example, various fluorescent or phosphorescent organic materials known in the art. The emitting layer may also be formed by employing the electron accepting organic compound described above or suitable one exhibiting an emitting characteristic selected from electron donating organic compounds to be described later.

The material for the emitting layer may be, but is not limited to, a fluorescent material such as an Alq-based material such as tris(4-methyl-8-quinolinolate)aluminum (III) (Alg3), 4-MAlq3 or Gaq3; a cyclopenadiene derivative such as C-545T($C_{26}H_{26}N_2O_2S$), DSA-amine, TBSA, BTP, PAP-NPA, spiro-FPA, $Ph_3Si$ (PhTDAOXD), 1,2,3,4,5-pentaphenyl-1,3-cyclopentadiene (PPCP), 4,4'-bis(2,2'-diphenylyinyl)-1,1'-biphenyl (DPVBi), distyryl benzene or a derivative thereof, or 4-(dicyanomethylene)-2-tert-butyl-6-(1,1,7,7,-tetramethyljulolidyl-9-enyl)-4H-pyran (DCJTB), DDP, AAAP or NPAMLI; or a phosphorescent material such as Firpic, m-Firpic, N-Firpic, $bon_2Ir(acac)$, $(C_6)_2Ir(acac)$, $bt_2Ir(acac)$, $dp_2Ir(acac)$, $bzq_2Ir(acac)$, $bo_2Ir(acac)$, $F_2Ir$(bpy), $F_2Ir(acac)$, $op_2Ir(acac)$, $ppy_2Ir(acac)$, $tpy_2Ir(acac)$, fac-tris[2-(4,5'-difluorophenyl)pyridine-C'2,N] iridium(III) (Flrppy) or bis(2-(2'-benzo[4,5-a]thienyl)pyridinato-N,C3') iridium(acetylactonate) ($Btp_2Ir(acac)$). The emitting layer may include the material as a host, and a host-dopant system including perylene, distyrylbiphenyl, DPT, quinacridone, rubrene, BTX, ABTX or DCJTB as a dopant.

The organic stacked structure may be present in various types including another layer known in the art, as long as it includes at least the low refractive organic layer and the emitting layer.

For example, when the lowly organic layer includes an electron accepting organic compound, and thus serves as an electron transport layer, as a layer further included in the organic stacked structure, a hole injection layer (HIL), a hole transport layer (HTL), an electron injection layer (EIL) or a hole blocking layer (HBL) may be used.

Here, the hole injection layer may be a layer further included in contact with the hole injection electrode layer to assist smooth injection of holes into the organic stacked structure from the electrode layer. In addition, the hole transport layer may be present, for example, between the emitting layer and the hole injection electrode layer and have a higher level of highest occupied molecular orbital (HOMO) than that of the emitting layer, thereby assisting smooth transport of holes.

The hole injection or hole transport layer may include, for example, an electron donating organic compound. As the electron donating organic compound, N,N',N'-tetraphenyl-4,4'-diaminophenyl, N,N'-diphenyl-N,N'-di(3-methylphenyl)-4,4'-diaminobiphenyl, 2,2-bis(4-di-p-tollylaminophenyl)propane, N,N,N',N'-tetra-p-tollyl-4,4'-diaminobiphenyl, bis(4-di-p-tollylaminophenyl)phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quadriphenyl, 4-N,N-diphenylamino-(2-diphenylvinyl)benzene, 3-methoxy-4'-N,N-diphenylaminostyrylbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tollyl)amine, 4-(di-p-tollylamino)-4'-[4-(di-p-tollylamino)styryl]stilbene, N,N,N',N'-tetraphenyl-4,4'-diaminobiphenyl N-phenylcarbazole, 4,4'-bis[N-(1-naphthyl)-N-phenylamino]biphenyl, 4,4"-bis[N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4"-bis[N-(1-anthryl)-N-phenylamino]-p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tollylamino)naphthalene, 2,6-bis[di-(1-naphthyl)amino]naphthalene, 2,6-bis[N-(1-naphthyl)-N-(2-naphthyl)amino]naphthalene, 4,4"-bis[N,N-di(2-naphthyl)amino]terphenyl, 4,4-bis{N-phenyl-N-[4-(1-naphthyl)phenyl]amino}biphenyl, 4,4'-bis[N-phenyl-N-(2-pyrenyl)amino]biphenyl, 2,6-bis[N,N-di-(2-naphthyl)amino]fluorine or 4,4"-bis(N,N-di-p-tollylamino)terphenyl, or an aryl amine compound such as bis(N-1-naphthyl)(N-2-naphthyl)amine may be used, but the present application is not limited thereto.

The hole injection layer or hole transport layer may be formed by dispersing the organic compound in a polymer, or using a polymer derived from the organic compound. In addition, a π-conjugated polymer such as polyparaphenylenevinylene and a derivative thereof, a hole transport non-conjugated polymer such as poly(N-vinylcarbazole) or a σ-conjugated polymer of polysilane may also be used.

The hole injection layer may be formed using an electrically-conductive polymer such as a metal phthalocyanine such as copper phthalocyanine or a non-metal phthalocyanine, a carbon layer and polyaniline, or may be formed by reaction with a Lewis acid using the aryl amine compound as an oxidizing agent.

The electron injection layer may be a layer for assisting injection of electrons into the organic stacked structure from the electrode layer, and may be further included in contact with the electron injection electrode layer when necessary. The electron injection layer may be formed using a known material such as LiF or CsF. The hole blocking layer may be a layer capable of enhancing a life span and efficiency of the device by preventing approach of holes injected from the hole injection electrode layer to the electron injection electrode layer through the emitting layer, and may be formed in a suitable part between the emitting layer and the electron injection electrode layer using a known material when necessary.

The organic stacked structure may be formed in various structures. For example, when the low refractive organic layer serves as an electron transport layer, the organic stacked structure may include: an emitting layer and a low refractive organic layer; an emitting layer, a low refractive organic layer and an electron injection layer; a hole transport layer, an emitting layer and a low refractive organic layer; a hole injection layer, a hole transport layer, emitting layer and a low refractive organic layer; a hole transport layer, emitting layer, a hole blocking layer and a low refractive organic layer; a hole injection layer, a hole transport layer, emitting layer, a hole blocking layer and a low refractive organic layer; a hole transport layer, emitting layer, a low refractive organic layer and an electron injection layer; or a hole injection layer, a hole transport layer, emitting layer, a low refractive organic layer and an electron injection layer, which are sequentially formed from the hole injection electrode layer, but the present application is not limited thereto. When necessary, the organic stacked structure may have a structure including at least two emitting layers. The structure including at least two emitting layers may include at least two emitting layers divided by an inter-electrode layer having a charge generating characteristic or a charge generating layer (CGL) are present at a suitable position in the organic stacked structure, but the present application is not limited thereto.

The OLED may also include a scattering layer. The scattering layer may be a layer capable of increasing the light extraction efficiency of the device through interaction with the low refractive organic layer, and may be formed using any known material and structure as long as they serve to scatter incident light.

Figure 2:
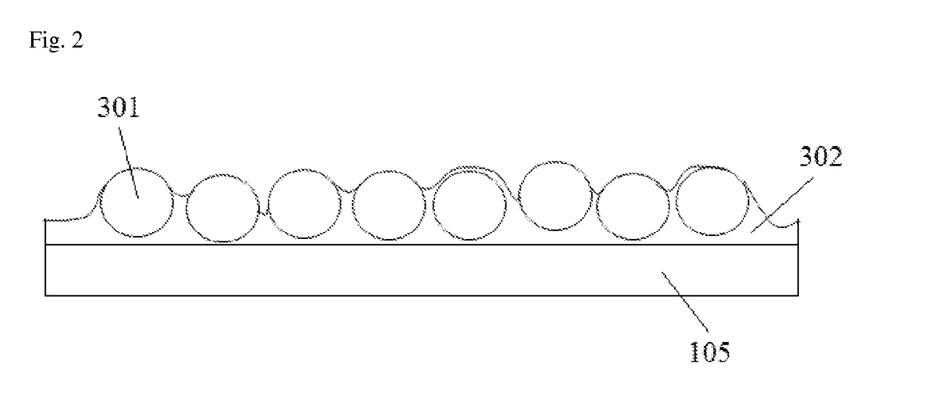
FIGS. 2 and 3 show schematics of illustrative embodiments of the scattering layers.

In one embodiment, the scattering layer may be a layer including scattering particles. FIG. 2 shows an illustrative shape in which a scattering layer including scattering particles 301 is formed on a base layer 105. The scattering layer of FIG. 2 includes scattering particles 301 and a binder 302.

The term "scattering particles" used herein may refer to, for example, particles having a different refractive index from that of the binder for forming the scattering layer or a planarizing layer to be described later. These particles may have a refractive index of 1.0 to 3.5, for example, approximately 1.0 to 2.0, 1.2 to 1.8, 2.1 to 3.5 or 2.2 to 3.0, and an average diameter of approximately 50 to 20,000 or 100 to 5,000 nm. The particles may have a spherical, oval, polygonal or amorphous shape, but the present application is not particularly limited thereto. The scattering particles may include, for example, an organic material such as polystyrene or a derivative thereof, an acrylic resin or a derivative thereof, a silicon resin or a derivative thereof, or a novolac resin or a derivative thereof, or an inorganic material such as silica, alumina, titanium oxide or zirconium oxide. The scattering particles may include any one of the above materials, or at least two thereof, or may be formed in core/shell-type particles or hollow-type particles as needed.

The scattering layer may further include a binder for maintaining the scattering particles. As the binder, as a material capable of maintaining the scattering particles, another adjacent material, for example, a material having the same refractive index as that of the base layer 105 may be used. As the binder, for example, a heat- or photo-curable monomeric, oligomeric, or polymeric organic material including polyimide, a caldo resin having a fluorene ring, urethane, epoxide, polyester, or acrylate, an inorganic material such as silicon oxide, silicon nitride, silicon oxynitride, or polysiloxane, or an organic/inorganic combination material.

Figure 3:
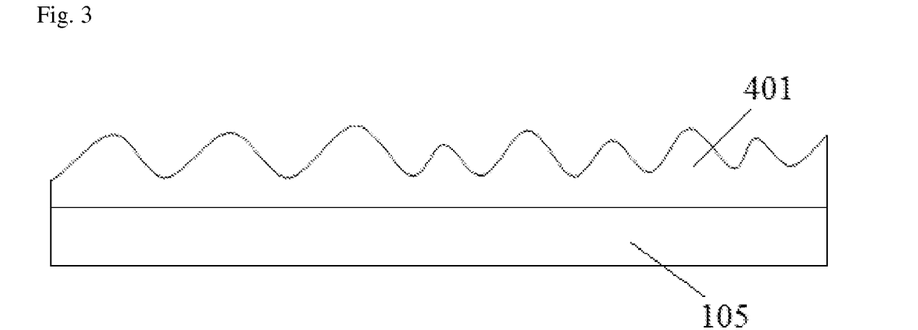

The scattering layer may be, for example, a layer having an uneven structure. FIG. 3 exemplarily shows that a scattering layer 401 having an uneven structure is formed on a base layer 105. When the uneven structure of the scattering layer is suitably controlled, incident light may be scattered.

The scattering layer having an uneven structure may be formed, for example, by coating a heat- or photo-curable material, and curing the material in contact with a mold capable of transferring a desired shape of the uneven structure during curing or performing an etching process. In another method, the scattering layer may be formed by blending particles having a suitable size and shape in a binder for forming the scattering layer. In this case, the particles may not need to be particles having a scattering function, but particles having a scattering function may also be used.

For example, the scattering layer may be formed by coating a material by wet coating, and performing application of heat or irradiation of light, curing of the material by a sol-gel method, a deposition method such as a chemical vapor deposition (CVD) or physical vapor deposition (PVD) method, or a microembossing method.

Figure 4:
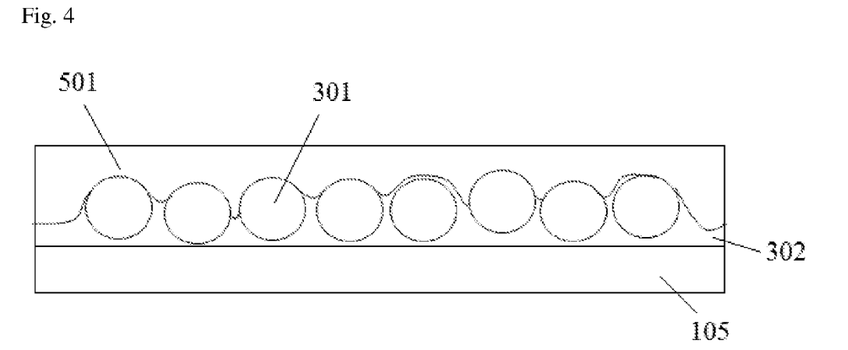
FIGS. 4 and 5 show schematics of illustrative embodiments of the OLEDs including the planarizing layers.
Figure 5:
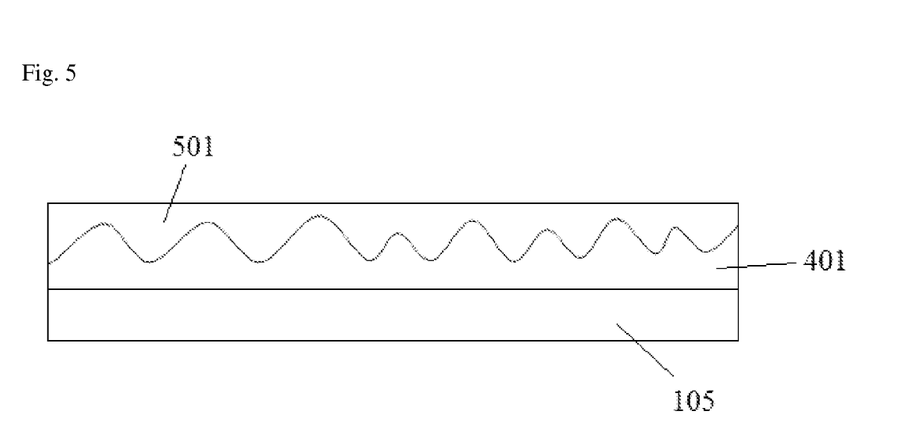

The OLED may further include a planarizing layer formed on the top of the scattering layer. FIGS. 4 and 5 exemplarily show OLEDs further including a planarizing layer. FIG. 4 shows that a planarizing layer 501 is formed on the scattering layer having the structure shown in FIG. 2, and FIG. 5 shows that a planarizing layer 501 is formed on the scattering layer having the structure shown in FIG. 3.

The planarizing layer provides a surface on which the electrode layer such as the hole injection electrode layer may be formed on the scattering layer, and in some case, may embody more excellent light extraction efficiency through interaction with the scattering layer. The planarizing layer may, for example, have the same refractive index as that of the adjacent electrode layer, for example, approximately 1.8 to 3.5 or 2.2 to 3.0.

The planarizing layer may be formed by, for example, a method of mixing high refractive particles having a high refractive index and an average diameter of approximately 1 to 100, 10 to 90, 20 to 80, 30 to 70, 30 to 60 or 30 to 50 nm with a binder for forming the planarizing layer. As the high refractive particles, for example, alumina, titanium oxide or zirconium oxide may be used. In one embodiment, as the high refractive particles, titanium oxide, for example, rutile-type titanium oxide may be sued. The rutile-type titanium oxide may have a higher refractive index than those of other particles, and thus even though a content of the high refractive particles in the material for forming the planarizing layer is relatively small, the planarizing layer may have a high refractive index. When the ratio of the high refractive particles is relatively low in the material, a higher quality of planarizing layer may be embodied.

In another embodiment, the planarizing layer may also be formed using a material prepared by blending a compound such as an alkoxide or acylate of a metal such as zirconium, titanium or cesium with a binder having a polar group such as a carboxylic group or a hydroxyl group. The compound such as an alkoxide or acrylate may be condensed with the polar group of the binder, and provide the metal to a backbone of the binder, thereby embodying a highly refractive index. Examples of the alkoxide or acrylate compound may include a titanium alkoxide such as tetra-n-butoxy titanium, tetraisopropoxy titanium, tetra-n-propoxy titanium or tetraethoxy titanium, a titanium acylate such as titanium stearate, a titanium chelate, a zirconium alkoxide such as tetra-n-butoxy zirconium, tetra-n-propoxy zirconium, tetraisopropoxy zirconium or tetraethoxy zirconium, a zirconium acylate such as zirconium tributoxystearate, or a zirconium chelate. In addition, as the binder having a polar group, suitable one selected from the binders described in the category of the scattering layer may be used.

In addition, the planarizing layer may be formed by preparing a coating solution by blending a metal alkoxide such as titanium alkoxide or zirconium alkoxide with a solvent such as alcohol or water, coating the coating solution, and plasticizing the coated solution at a suitable temperature by sol-gel coating.

The scattering layer or the planarizing layer may have a smaller projected area than that of the hole or electron injection electrode layer formed thereon. The scattering layer or the scattering layer and planarizing layer may also have a smaller projected area than that of the base layer. The term "projected area" used herein refers to a projected area of a target recognized when the substrate is observed from above or below in a direction parallel to a normal line of a surface thereof, for example, an area of the base layer, the scattering layer or the electrode layer. Accordingly, for example, even though a substantial surface area is larger than that of the electrode layer because a surface of the scattering layer is formed in an uneven shape, when an area recognized by observing the scattering layer from above is smaller than that recognized by observing the electrode layer from above, it is construed that the scattering layer has a smaller projected area than that of the electrode layer.

The scattering layer may be present in various types when it has a smaller projected area than those of the base layer and the electrode layer. For example, the scattering layer 104, as shown in FIG. 6, may be formed only in a part other than an edge of the base layer 105, or as shown in FIG. 7, may partially remain on an edge of the base layer 105.

Figure 6:
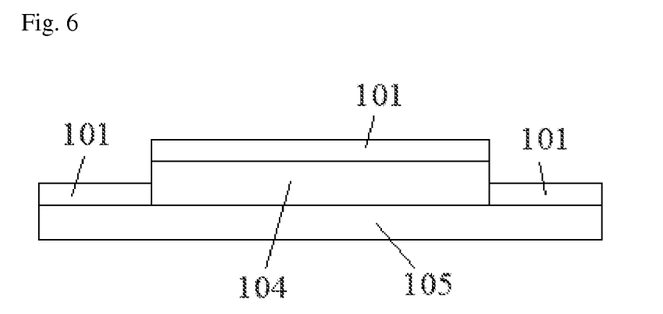
FIGS. 6 to 8 show schematics of illustrative embodiments of the base layer, the scattering layer and the hole injection electrode layer in the OLEDs.
Figure 7:
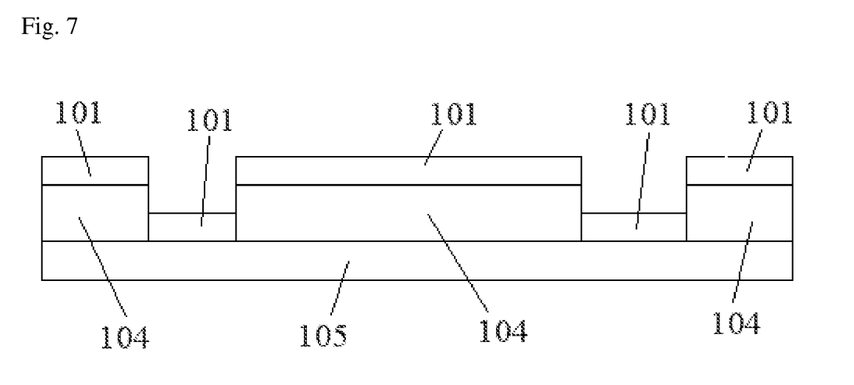
Figure 8:
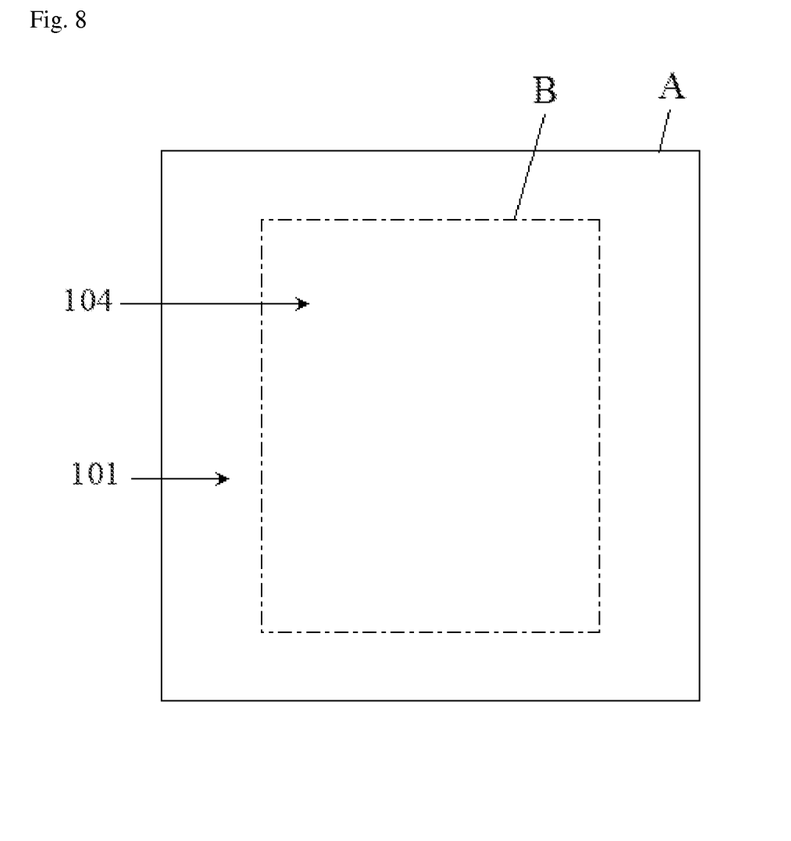

FIG. 8 exemplarily shows that the scattering layer of FIG. 6 is observed from above. As shown in FIG. 8, an area (A), that is, a projected area (A), of the electron or hole injection electrode layer 101 recognized when the scattering layer is observed from above is larger than that of a projected area (B) of the scattering layer 104 disposed therebelow. A ratio (A/B) of the projected area (A) of the electrode layer 101 and the projected area (B) of the scattering layer may be, for example, 1.04, 1.06, 1.08, 1.1, or 1.15 or more. When the projected area of the scattering layer is smaller than that of the electrode layer, since a structure in which the scattering layer is not exposed to an external environment can be embodied as will be described later, the upper limit of the ratio (A/B) in projected area is not particularly limited. In consideration of a general environment of manufacturing a substrate, the upper limit of the ratio (A/B) may be, for example, approximately 2.0, 1.5, 1.4, 1.3 or 1.25. Here, the electron injection or hole injection electrode layer may be formed on the top of the base layer on which the scattering layer is not formed. The electrode layer may be formed in contact with the base layer, or an additional component may be further included between the electrode layer and the base layer. According to such a structure, a structure in which the scattering layer is not exposed to an external environment may be embodied.

For example, as shown in FIG. 8, the electron injection or hole injection electrode layer may be formed in a region including a region beyond all peripheral regions of the scattering layer when observed from above. In this case, for example, as shown in FIG. 7, when a plurality of scattering layers 104 are present on the base layer, the electrode layer 101 may be formed up to the region including the region beyond all the peripheral regions of at least one scattering layer, for example, the scattering layer on which an organic layer will be formed at least the top thereof. For example, in the structure of FIG. 7, when the organic layer is formed on the top of the scattering layer present on the right and left edges, the structure of FIG. 7 may be changed to form the electrode layer up to the region beyond all the peripheral regions of the scattering layer present on the right and left edge by extending to left and right sides. In such a structure, when an encapsulating structure to be described later is attached to the electrode layer below which the scattering layer is not formed, a structure in which the scattering layer is not exposed to an external environment may be formed. Accordingly, penetration of external moisture or oxygen through the highly refractive layer and the like may be prevented, an adhesive strength between the encapsulating structure or the electrode and the substrate may be stably ensured, and a surface hardness at the edge of the device may be excellently maintained.

Controlling of the projected area may be performed by, for example, forming the electrode layer to have a larger projected area than that of the scattering layer during a deposition or sputtering process for forming the electrode layer, and when necessary, by removing a predetermined part of the scattering layer and/or planarizing layer to pattern.

The OLED may be present in a suitable encapsulating structure to prevent moisture or oxygen from an external environment. That is, the OLED may further include an encapsulating structure for protecting the electrode layer and the organic stacked structure. The encapsulating structure may be, for example, a can such as a glass can or a metal can, or a film covering an entire surface of the organic stacked structure.

Figure 9:
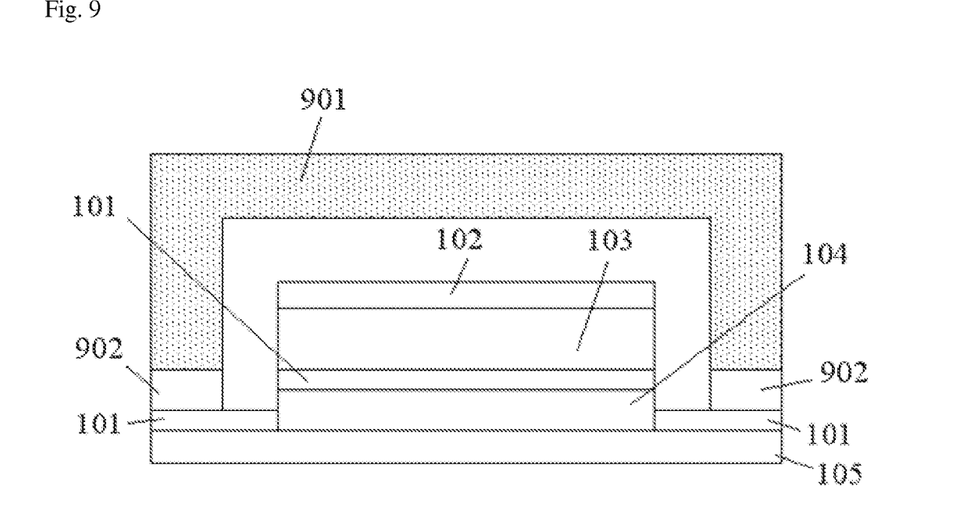
FIGS. 9 and 10 show schematics of illustrative embodiments of the OLEDs.

FIG. 9 exemplarily shows that a can-type encapsulating structure 901 such as a glass can or a metal can is further included as an encapsulating structure 901 for projecting an electron injection electrode layer 102 and an organic stacked structure 103, which are sequentially formed. As shown in FIG. 9, the encapsulating structure 901 may be, for example, attached to a hole injection electrode layer 101 by an adhesive 902. The encapsulating structure may be, for example, adhered to the hole injection electrode layer 101 below which a scattering layer 104 is not present. For example, as shown in FIG. 9, the encapsulating structure 901 may be attached to the electrode layer 101 present on an edge of a base layer 105 by the adhesive 902. In this manner, a protective effect by the encapsulating structure may be optimized.

Figure 10:
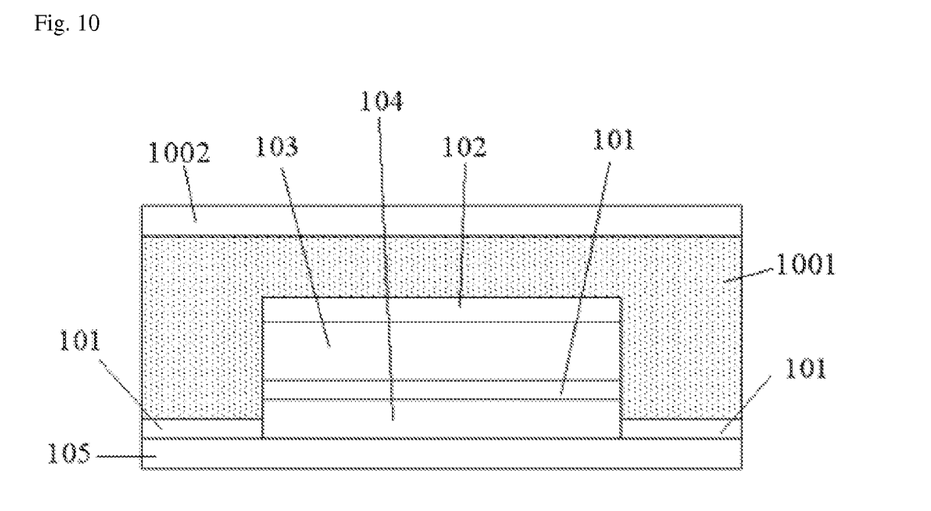

The encapsulating structure may be, for example, a film coating entire surfaces of the organic stacked structure and the electron injection electrode layer. FIG. 10 shows an illustrative film-type encapsulating structure 1001 covering entire surfaces of an organic stacked structure 103 and an electron injection electrode layer. For example, the film-type encapsulating structure 1001, as shown in FIG. 10, may have a structure coating the entire surfaces of the organic stacked structure 103 and the electrode layer 102, and adhered to a second substrate 1002 on the top of a base layer 105 having a scattering layer 104 and a hole injection electrode layer 101. Here, as the second substrate 1002, for example, a glass substrate, a metal substrate, a polymer film or a barrier layer may be used. The film-type encapsulating structure may be formed by, for example, coating a liquid material cured by heat or UV radiation such as an epoxy resin and curing the liquid material, or laminating the substrate with the upper substrate using an adhesive sheet previously manufactured in a film type using the epoxy resin.

The encapsulating structure may include a water adsorbent or getter such as a metal oxide such as calcium oxide or beryllium oxide, a metal halide such as calcium oxide, or phosphorus pentoxide, when necessary. For example, the water adsorbent or getter may be included in the film-type encapsulating structure, or present at a predetermined position of a can-type encapsulating structure. The encapsulating structure may further include a barrier film or a conductive film.

As shown in FIG. 9 or 10, the encapsulating structure may be attached to, for example, the top of the hole injection electrode layer 101 below which the scattering layer 104 is not formed. Accordingly, a sealing structure in which the scattering layer and the like are not exposed to an external environment may be embodied. The sealing structure may refer to, for example, a state in which the entire surface of the scattering layer is not exposed to an external environment by being surrounded by the base layer, the electrode layer and/or the encapsulating structure, or by being surrounded by the sealing structure formed to include the base layer, the electrode layer and/or the encapsulating structure. The sealing structure may be formed to only include the base layer, the electrode layer and/or the encapsulating structure, or to include the base layer, the electrode layer, the encapsulating structure, and also another component, for example, a conductive material or an intermediate layer as long as the highly refractive layer is not exposed to an external environment. For example, in FIG. 9 or 10, another component may be present at a part in which the base layer 105 is in contact with the electrode layer 101 or the electrode layer 101 is in contact with the encapsulating structure 901 or 1001 or another position. As the another component, an organic, inorganic or organic/inorganic combination material having a low water permeability, an insulating layer or an auxiliary electrode layer may be used.

Another aspect of the present application provides a use of the OLED. The OLED may be effectively applied to a backlight of a liquid crystal display (LCD), lightings, sensors, printers, a light source of a copy machine, a light source for an automobile gauge, a signal light, a pilot lamp, a display device, a light source for a planar emitting device, a display, decorations or other kinds of lights. In one embodiment, the present application relates to a lighting device including the OLED. When the OLED is applied to the lighting device or for different uses, other components constituting the device or a method of constituting the device is not particularly limited, but all of arbitrary materials or methods known in the related art may be employed as long as these are used in the OLED.

Effect

An illustrative OLED of the present application can minimize light absorption of a reflective electrode layer and evanescent coupling by surface plasmon, and exhibit excellent emitting efficiency.

DESCRIPTION OF THE MARKS

100, 200: the organic light emitting device
101, 102: the electrode layer
103: the organic lamination structure
1031: the low refractive organic layer
1032: the light emitting layer
105: the base layer
301: the scattering particle
302: the binder
104, 401: the scattering layer
501: the planarizing layer

ILLUSTRATIVE EMBODIMENTS

An OLED will be described in detail with reference to Example and Comparative Examples, but the scope of the OLED is not limited to the following Example.

Example 1

A sol-gel coating solution was prepared by sufficiently dispersing 1 g of polymer beads (XX75BO, average diameter: approximately 3 μm, Sekisui) in 10 g of tetramethoxy silane. Subsequently, a scattering layer was formed by coating the prepared coating solution on a glass substrate and performing a sol-gel reaction. Afterward, a planarizing layer having a refractive index of approximately 1.8 was formed by coating a highly refractive coating solution prepared by blending highly refractive titanium oxide particles having an average diameter of approximately 10 nm and a refractive index of approximately 2.5 in the sol-gel coating solution including tetramethoxy silane in the same manner as described above on the top of the scattering layer, and performing a sol-gel reaction in the same manner as in described above. Subsequently, the light scattering layer and the planarizing layer were partially removed by radiating a laser to the formed layer such that positions of the remaining light scattering layer and the planarizing layer corresponded to an emitting region of an organic layer to be subsequently formed. After the removal, a hole injection electrode layer including ITO was formed on the entire surface of the glass substrate to have a predetermined thickness by a known sputtering method. Subsequently, a hole injection layer including N,N'-Di-[(1-naphthyl)-N,N'-diphenyl]-1,1'-biphenyl)-4,4'-diamine (α-NPD) and an emitting layer (4,4',4"-tris(N-carbazolyl)-triphenylamine (TCTA):Firpic, TCTA:Fir6) were sequentially formed by a known deposition method. A low refractive organic layer was then formed to a thickness of approximately 70 nm by codepositing an electron transport compound, 4,4',4"-tris(N-carbazolyl)-triphenylamine (TCTA) and a low refractive material, LiF (refractive index: approximately 1.39) on the top of the emitting layer to have a refractive index of the entire layer of approximately 1.66. Subsequently, a device was manufactured by forming an aluminum (Al) electrode as the electron injection reflective electrode on the top of the low refractive organic layer by a vacuum deposition method. Subsequently, a system was manufactured by attaching an encapsulating structure to the device in a glove box at an Ar gas atmosphere. Afterward, the system was taken out in the air, and a voltage-current characteristic, luminescence and efficiency were measured when a current density was 3 mAcm$^{-2}$ from a Half Moon. Meanwhile, here, a refractive index was a value measured in a wavelength of approximately 550 nm using an ellipsometer produced by Nanoview.

Comparative Example 1

An OLED was manufactured as described in Example 1, except that a layer of only an electron transport compound, TCTA was formed on an emitting layer to have a thickness of approximately 70 nm instead of a low refractive organic layer.

Comparative Example 2

An OLED was manufactured as described in Example 1, except that a scattering layer and a planarizing layer were not formed.

Comparative Example 3

An OLED was manufactured as described in Example 1, except that a scattering layer and a planarizing layer were not formed, and a layer of only an electron transport compound, TCTA was formed on an emitting layer to have a thickness of approximately 70 nm instead of a low refractive organic layer.

Comparative Example 4

An OLED was manufactured as described in Example 1, except that a codeposition layer of an electron transport compound, TCTA, and yttrium oxide (Y$_2$O$_3$) having a refractive index of approximately 1.79 was formed on an emitting layer to have a thickness of approximately 70 nm instead of a low refractive organic layer.

Comparative Example 5

An OLED was manufactured as described in Example 1, except that a layer of only an electron transport compound, TCTA was formed on an emitting layer to have a thickness of approximately 20 nm instead of a low refractive organic layer.

Results of evaluation of performance with respect to Example and Comparative Examples are shown in Table 1. In Table 1, evaluation of absolute quantum efficiency was performed by a known method.

TABLE 1

|  | Drive voltage (V) | Absolute quantum efficiency (%) |
| --- | --- | --- |
| Example 1 | 2.7 | 48.1 |
| Comparative example 1 | 2.8 | 30.6 |
| Comparative example 2 | 2.7 | 19.2 |
| Comparative example 3 | 2.7 | 16.5 |
| Comparative example 4 | 3.2 | 29.1 |
| Comparative example 5 | 2.5 | 20.1 |

What is claimed is:
1. An organic light emitting device, comprising:
an electron injecting electrode layer and a hole injecting electrode layer;
an organic stacked structure that is between the electron and hole injecting electrode layers, and that comprises an light emitting layer and a low refractive organic layer, of which a refractive index is 1.7 or less; and
a scattering layer disposed in contact with or adjacent to a side of the hole or electron injecting electrode layer opposite to a side facing the organic stacked structure,
wherein the scattering layer comprises scattering particles, of which refractive index is in a range of 1.0 to 3.5 and an average diameter is in a range of 50 nm to 20,000 nm,
wherein the low refractive organic layer comprises a low refractive material and an organic compound, and comprises 100 to 150 parts by weight of the low refractive material with respect to 100 parts by weight of the organic compound.
2. The organic light emitting device according to claim 1, further comprising: a base layer, on which the hole injecting electrode layer, the organic stacked structure and the electron injecting electrode layer are sequentially formed.
3. The organic light emitting device according to claim 2, wherein the scattering layer is between the hole injecting electrode layer and the base layer.
4. The organic light emitting device according to claim 2, wherein the hole injecting electrode layer is a transparent electrode layer, and the electron injecting electrode layer is a reflective electrode layer.
5. The organic light emitting device according to claim 2, wherein the low refractive organic layer comprises an electron accepting organic compound.
6. The organic light emitting device according to claim 5, wherein the low refractive organic layer is in contact with the electron injecting electrode layer.
7. The organic light emitting device according to claim 3, wherein the scattering layer has a smaller projected area than the hole injecting electrode layer, and the hole injecting electrode layer is formed on both of the scattering layer and the base layer on which the scattering layer is not formed.
8. The organic light emitting device according to claim 7, further comprising: an encapsulating structure for protecting the organic stacked structure and the electron injecting electrode layer, wherein the encapsulating structure is attached on the hole injecting electrode layer below which the scattering layer is not formed.

9. The organic light emitting device according to claim 8, wherein the encapsulating structure is a glass can or a metal can, or a film covering entire surfaces of the organic stacked structure and the electron injection electrode layer.

10. The organic light emitting device according to claim 1, wherein the low refractive material is selected from the group consisting of lithium fluoride (LiF), magnesium fluoride ($MgF_2$), potassium fluoride (KF), sodium fluoride (NaF), aluminum fluoride ($AlF_2$), barium fluoride ($BaF_2$), beryllium fluoride ($BeF_2$), cadmium fluoride ($CdF_2$), calcium fluoride ($CaF_2$), cesium fluoride (CsF), thorium fluoride ($ThF_4$), yttrium fluoride ($YF_3$), iron fluoride ($FeCl_2$), vanadium fluoride ($V_2O_5$) and $Na_2Al_3F_{14}$ (Chiolite).

11. The organic light emitting device according to claim 1, wherein the low refractive organic layer has a thickness of 15 nm or more.

12. The organic light emitting device according to claim 1, wherein the scattering layer comprises an uneven structure.

13. The organic light emitting device according to claim 1, further comprising: a planarizing layer on the scattering layer.

14. The organic light emitting device according to claim 13, wherein the planarizing layer has a refractive index of 1.8 to 3.5.

15. The organic light emitting device according to claim 13, wherein the planarizing layer comprises high refractive particles, of which an average diameter is in the range from 1 nm to 100 nm.

16. The organic light emitting device according to claim 15, wherein the high refractive particles are rutile titanium oxide.

17. Lighting comprising the organic light emitting device of claim 1.

* * * * *